(12) United States Patent
Sharma (10) Patent No.: US 12,295,097 B1
(45) Date of Patent: May 6, 2025

(54) COMPACT CERAMIC PACKAGE WITH REAR CAVITIES

(71) Applicant: Waymo LLC, Mountain View, CA (US)

(72) Inventor: Shashank Sharma, Mountain View, CA (US)

(73) Assignee: Waymo LLC, Mountain View, CA (US)

( * ) Notice: Subject to any disclaimer, the term of this patent is extended or adjusted under 35 U.S.C. 154(b) by 654 days.

(21) Appl. No.: 17/550,597

(22) Filed: Dec. 14, 2021

Related U.S. Application Data (60) Provisional application No. 63/131,168, filed on Dec. 28, 2020.

(51) Int. Cl.
| | |
|---|---|
| *H05K 1/03* | (2006.01) |
| *G01S 7/4914* | (2020.01) |
| *H01L 27/146* | (2006.01) |
| *H10F 39/00* | (2025.01) |

(52) U.S. Cl.
CPC .......... *H05K 1/0306* (2013.01); *G01S 7/4914* (2013.01); *H10F 39/811* (2025.01)

(58) Field of Classification Search
CPC ............ H10K 1/0306; H01L 27/14636; G01S 7/4914
See application file for complete search history.

(56) References Cited

U.S. PATENT DOCUMENTS

| | | |
|---|---|---|
| 8,248,523 B2 | 8/2012 | Chua et al. |
| 8,514,317 B2 | 8/2013 | Lin |
| 8,564,716 B2 | 10/2013 | Kim |
| 8,976,291 B2 | 3/2015 | Chen |

(Continued)

FOREIGN PATENT DOCUMENTS

| | | |
|---|---|---|
| CN | 103633033 B | 3/2014 |
| CN | 103633034 B | 3/2014 |

(Continued)

OTHER PUBLICATIONS

Understanding The Digital Image Sensor, https://thinklucid.com/tech-briefs/understanding-digital-image-sensors/.

(Continued)

*Primary Examiner* — Fernando L Toledo
*Assistant Examiner* — Marshall Mu-Nuo Hatfield
(74) *Attorney, Agent, or Firm* — McDonnell Boehnen Hulbert & Berghoff LLP (57) ABSTRACT

A planar sensor array, like an imaging sensor array, can be mounted to a ceramic circuit board to provide improved mechanical stability and heat dissipation. Embodiments herein provide improvements to such assemblies by providing two or more recesses in the ceramic circuit board opposite the sensor array. Electronic components can be placed in these recesses, reducing the overall size and moment of inertia of the sensor assembly relative to placement on the same side of the ceramic circuit board as the sensor array. Placing the electronics in the two or more recesses allows for simplified mounting of the assembly to heat sinks, flexible circuit boards, or other elements. The two or more recesses are separated by a stiffening cross-brace portion of the ceramic circuit board that enhances the mechanical strength of the ceramic circuit board.

20 Claims, 4 Drawing Sheets

(56) References Cited

U.S. PATENT DOCUMENTS

| | | | |
|---|---|---|---|
| 8,982,257 B2 | 3/2015 | Chen et al. | |
| 9,214,592 B2 | 12/2015 | Oganesian | |
| 9,241,097 B1* | 1/2016 | Tam | H01L 27/14618 |
| 10,536,619 B2 | 1/2020 | Hsu et al. | |
| 2008/0173792 A1 | 7/2008 | Yang et al. | |
| 2012/0320260 A1 | 12/2012 | Ha et al. | |
| 2013/0221468 A1* | 8/2013 | Bolognia | G01T 1/24 |
| | | | 257/433 |
| 2017/0245370 A1* | 8/2017 | Wang | B29C 45/14639 |
| 2018/0063395 A1* | 3/2018 | Vehkaperä | H04N 23/57 |
| 2018/0182801 A1* | 6/2018 | Tan | H01L 27/14634 |
| 2019/0165028 A1* | 5/2019 | Wang | H01L 27/14636 |
| 2019/0371861 A1* | 12/2019 | Kim | H01L 27/14603 |
| 2020/0105810 A1* | 4/2020 | Moon | H01L 31/103 |
| 2020/0389608 A1* | 12/2020 | Baek | H01L 27/1463 |
| 2021/0242099 A1* | 8/2021 | Takeshita | H01L 23/13 |

FOREIGN PATENT DOCUMENTS

| | | |
|---|---|---|
| CN | 104796588 B | 7/2015 |
| CN | 107155048 A | 9/2017 |
| JP | 2007042746 A | 2/2007 |
| KR | 20070045825 A | 5/2007 |
| KR | 100758686 B1 | 9/2007 |
| WO | 2017140092 A1 | 8/2017 |

OTHER PUBLICATIONS

Camera Image Sensors, https://uk.kyocera.com/products/semiconductor_components/prd/camera_image_sensors/.

* cited by examiner

COMPACT CERAMIC PACKAGE WITH REAR CAVITIES

CROSS-REFERENCE TO RELATED APPLICATION

The present application is a non-provisional patent application claiming priority to U.S. Provisional Patent Application No. 63/131,168, filed on Dec. 28, 2020, the contents of which are hereby incorporated by reference.

BACKGROUND

High-performance planar imaging arrays, and camera assemblies incorporating such, may be designed to balance a wide range of application requirements. Such requirements can include mechanical strength, vibration resistance, cost of fabrication, and heat dissipation. For example, a camera assembly used in an autonomous vehicle may need to provide high-resolution and high frame rate images while maintaining operational temperatures below a threshold and also enduring thousands of hours of vibration and mechanical shocks and repeated temperature cycling. Such an assembly may also need to allow for replacement or servicing by repair technicians in non-ideal environments. To provide mechanical support and improved heat dissipation, planar imaging arrays or other planar sensor elements can be mounted to ceramic circuit boards.

SUMMARY

In one example, a sensor assembly includes: (i) a sensor element; (ii) a ceramic printed circuit board having a first side and a second side, wherein the first side is opposite the second side, wherein the sensor element is disposed on the first side of the ceramic printed circuit board, wherein the second side of the ceramic printed circuit board includes two or more recesses and a stiffening cross-brace portion that separates two of the two or more recesses, and wherein the ceramic printed circuit board comprises a first contact pad that is disposed on the first side and that is electrically coupled to the sensor element; and (iii) one or more electronic components, wherein the one or more electronic components are disposed on the second side of the ceramic printed circuit board within at least one of the two or more recesses, and wherein at least one electronic component of the one or more electronic components is electrically coupled to the first contact pad.

In another example, a ceramic printed circuit board is provided having a first side and a second side, wherein the first side is opposite the second side, wherein the second side of the ceramic printed circuit board includes two or more recesses and a stiffening cross-brace portion that separates two of the two or more recesses, wherein the ceramic printed circuit board comprises a first contact pad that is disposed on the first side and a second contact pad that is disposed on the second side in one of the two or more recesses and that is electrically coupled to the first contact pad.

In yet another example, a sensor assembly includes: (i) a sensor element; (ii) a ceramic printed circuit board having a first side and a second side, wherein the first side is opposite the second side, wherein the sensor element is disposed on the first side of the ceramic printed circuit board, wherein the second side of the ceramic printed circuit board includes a first recess, a second recess, and a stiffening cross-brace portion that separates the first and second recesses, and wherein the ceramic printed circuit board comprises a first contact pad that is disposed on the first side and that is electrically coupled to the sensor element; and (iii) one or more electronic components, wherein the one or more electronic components are disposed on the second side of the ceramic printed circuit board within at least one of the first recess or the second recess, and wherein at least one electronic component of the one or more electronic components is electrically coupled to the first contact pad.

These as well as other aspects, advantages, and alternatives will become apparent to those of ordinary skill in the art by reading the following detailed description with reference where appropriate to the accompanying drawings. Further, it should be understood that the description provided in this summary section and elsewhere in this document is intended to illustrate the claimed subject matter by way of example and not by way of limitation.

DETAILED DESCRIPTION

Exemplary implementations are described herein. It should be understood that the word "exemplary" is used herein to mean "serving as an example, instance, or illustration." Any implementation or feature described herein as "exemplary" or "illustrative" is not necessarily to be construed as preferred or advantageous over other implementations or features. In the figures, similar symbols typically identify similar components, unless context dictates otherwise. The example implementations described herein are not meant to be limiting. It will be readily understood that the aspects of the present disclosure, as generally described herein, and illustrated in the figures, can be arranged, substituted, combined, separated, and designed in a wide variety of different configurations.

I. OVERVIEW

A variety of sensors or other electronic components are formed as thin, fragile elements composed of silicon, gallium arsenide, or some other semiconductor material. These thin elements are then bonded to carriers composed of ceramic or other materials to provide mechanical stability and protection and to facilitate mechanically and electrically coupling the thin elements to other components of a system. An example of such a thin element is a semiconductor image sensor, which may be less than a millimeter thick while having an area of several square centimeters.

It is advantageous in a variety of applications to electrically and mechanically couple such a thin sensor element to a ceramic circuit board. Such a ceramic circuit board can protect the sensor element from vibrational, shock, or other mechanical loads, preventing cracks or other damage from occurring during manufacture of an assembly that includes the sensor element and/or during the operational lifetime of such a device. Ceramic circuit boards are also advantageous as their coefficient of thermal expansion can be made to better match that of the sensor element than common non-ceramic circuit board materials (e.g., fiberglass and/or organic composite materials). Further, ceramic circuit boards generally exhibit superior heat conduction relative to common non-ceramic circuit board materials. However, ceramic circuit board materials commonly have greater mass and increased fragility relative to common non-ceramic circuit board materials.

Embodiments described herein provide an improved ceramic circuit board to which can be mounted image sensors or other fragile electronic sensor elements. The ceramic circuit board includes a first side on which an image sensor or other element can be disposed. A second side of the ceramic circuit board, opposite the first side, includes two or more pits or cavities separated by a stiffening cross-brace portion that separates two of the two or more recesses. This stiffening cross-brace portion increases the overall mechanical durability of the ceramic circuit board.

Capacitors, ferrites, voltage regulators, or other components may be disposed within the two or more recesses. The second side also includes at least one contact pad via which the ceramic circuit board may be electrically connected to additional components. Placing the contact pad and other components on the second side of the ceramic circuit board allows the overall size of the ceramic circuit board to be reduced. This reduction provides a variety of benefits. These benefits include reducing the likelihood of the ceramic circuit board fracturing by reducing the overall aspect ratio of the ceramic circuit board (by making it less like a wide thin plate and more like a thick block of material). The benefits of size reduction also include reducing the rotational and translational inertia of the ceramic circuit board, allowing it to be mechanically actuated more easily and increasing the mechanical self-resonant frequency of systems that include the ceramic circuit board, thereby increasing stability. The benefits of size reduction also include reducing the minimum size of systems that incorporate the ceramic circuit board.

Placing the components on the second side of the ceramic circuit board within the two or more cavities provides a variety of benefits. These benefits include simplifying the design or fabrication of devices that include the ceramic circuit board by allowing the ceramic circuit board to be mounted onto a flat surface, e.g., a flat surface of a heatsink, a flat surface of a flex cable that extends across the recesses, etc. These benefits also include improving the transfer of heat from the ceramic circuit board into a heatsink or other component by allowing non-cavity portions of the second side of the ceramic circuit board to be in more proximate contact with the heatsink or other component.

II. EXAMPLE SYSTEMS

A variety of sensor types can be provided as substantially flat sensor elements. For example, a visible light, infrared, ultraviolet, or other variety of image sensor can be implemented as a substantially flat array of light-sensitive elements formed from silicon or some other semiconductor substrate material. Such image sensors can include arrays of CMOS sensor elements, charge coupled devices, arrays of silicon photomultipliers, or other light-sensitive elements. The photons of interest may be imaged directly by the sensor array (e.g., the bandgap of a semiconductor sensor array could be such that photons of interest are likely to be absorbed by the sensor array, resulting in a detectable electrical signal), or indirectly. For example, phosphors, image intensifiers, or other components could convert the photons (or other particles of interest) into photons, electrons, or other phenomena that can be detected by the sensor array. Other types of planar sensor arrays are possible, e.g., arrays of bolometers for long-wavelength infrared imaging, arrays of antenna elements (e.g., an array of terahertz antennas formed on and/or from a single thin planar piece of semiconductor material), a sensor array of an electrical capacitance tomographic sensor, an array of chemical sensors, etc.

Such planar sensor elements can be mounted to a ceramic circuit board as described herein to provide improved mechanical strength, reduced moment of inertia, improved thermal management, reduced cost, reduced size, simplified fabrication, or other benefits. These benefits are obtained by disposing on-board electronic components (e.g., capacitors, ferrites, voltage regulators) in two or more recesses on a side of the ceramic circuit board opposite a side of the ceramic circuit board on which the sensor element is mounted. The recesses are separated by a stiffening cross-brace portion of the ceramic circuit board.

A variety of systems could include such a sensor assembly. For example, an autonomous vehicle could include one or more such sensor assemblies to provide high-performance image sensing (e.g., high resolution, high frame rate visible light and/or infrared image sensing) in the mechanically and thermally demanding automotive environment.

Figure 1:
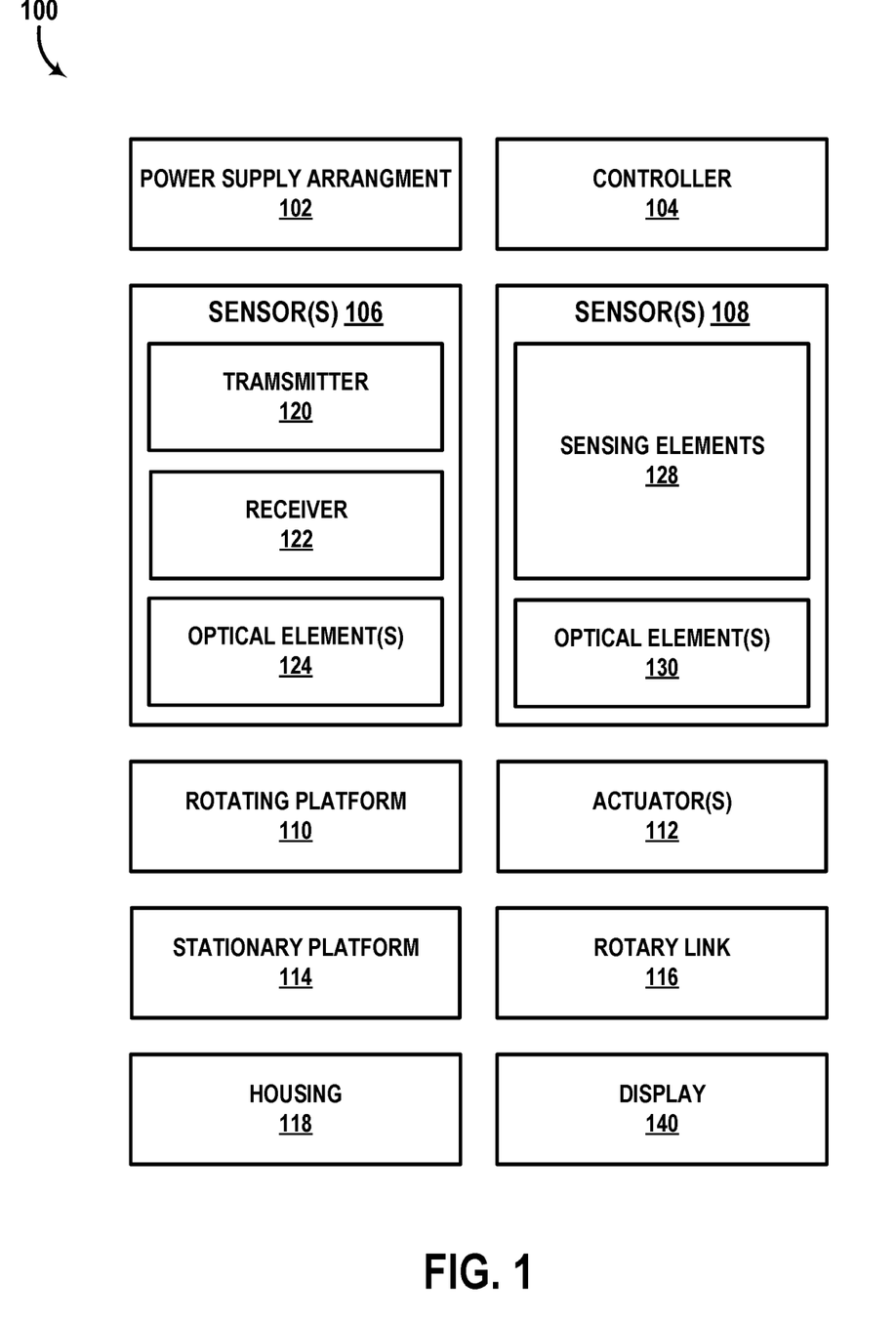
FIG. 1 is a simplified block diagram of a system, according to example embodiments.

Referring now to the figures, FIG. 1 is a simplified block diagram of a system 100 that includes sensors (e.g., sensor assemblies including ceramic circuit boards and related components as described herein), according to an example embodiment. As shown, system 100 includes a power supply arrangement 102, a controller 104, one or more sensors 106, one or more sensors 108, a rotating platform 110, one or more actuators 112, a stationary platform 114, a rotary link 116, a housing 118, and a display 140.

In other embodiments, system 100 may include more, fewer, or different components. Additionally, the components shown may be combined or divided in any number of ways. For example, sensor(s) 108 can be implemented as a single physical component (e.g., camera ring). Alternatively, for example, sensor(s) 108 can be implemented as an arrangement of separate physical components. Other examples are possible. Thus, the functional blocks of FIG. 1 are illustrated as shown only for convenience in description. Other example components, arrangements, and/or configurations are possible as well without departing from the scope of the present disclosure.

Power supply arrangement 102 may be configured to supply, receive, and/or distribute power to various components of system 100. To that end, power supply arrangement 102 may include or otherwise take the form of a power source (e.g., battery cells, etc.) disposed within system 100 and connected to various components of system 100 in any feasible manner, so as to supply power to those components. Additionally or alternatively, power supply arrangement 102 may include or otherwise take the form of a power adapter configured to receive power from one or more external power sources (e.g., from a power source arranged in a vehicle to which system 100 is mounted, etc.) and to transmit the received power to various components of system 100.

Controller 104 may include one or more electronic components and/or systems arranged to facilitate certain operations of system 100. Controller 104 may be disposed within system 100 in any feasible manner. In one embodiment, controller 104 may be disposed, at least partially, within a central cavity region of rotary link 116. In another embodiment, one or more functions of controller 104 can be alternatively performed by one or more physically separate controllers that are each disposed within a respective component (e.g., sensor(s) 106, 108, etc.) of system 100.

In some examples, controller 104 may include or otherwise be coupled to wiring used for transfer of control signals to various components of system 100 and/or for transfer of data from various components of system 100 to controller 104. Generally, the data that controller 104 receives may include sensor data based on detections of light by LIDAR 106 and/or camera(s) 108, among other possibilities. Moreover, the control signals sent by controller 104 may operate various components of system 100, such as by controlling emission and/or detection of light or other signal by sensor(s) 106 (e.g., LIDAR, etc.), controlling image pixel capture rate or times via a camera (e.g., included in sensor(s) 108), and/or controlling actuator(s) 112 to rotate rotating platform 110, among other possibilities.

To that end, in some examples, controller 104 may include one or more processors, data storage, and program instructions (stored in the data storage) executable by the one or more processors to cause system 100 to perform the various operations described herein. In some instances, controller 104 may communicate with an external controller or the like (e.g., a computing system arranged in a vehicle, robot, or other mechanical device to which system 100 is mounted) so as to help facilitate transfer of control signals and/or data between the external controller and the various components of system 100.

Additionally or alternatively, in some examples, controller 104 may include circuitry wired to perform the various functions described herein. Additionally or alternatively, in some examples, controller 104 may include one or more special purpose processors, servos, or other types of controllers. For example, controller 104 may include a proportional-integral-derivative (PID) controller or other control loop feedback apparatus that operates actuator(s) 112 to modulate rotation of rotating platform 110 according to a particular frequency or phase. Other examples are possible as well.

Sensors 106 and 108 can optionally include one or more sensors, such as LIDARs, cameras, gyroscopes, accelerometers, encoders, microphones, RADARs, SONARs, thermometers, etc., that scan a surrounding environment of system 100.

Sensor(s) 106 may include any device configured to scan a surrounding environment by emitting a signal and detecting reflections of the emitted signal. For instance, sensor(s) 106 may include any type of active sensor. To that end, as shown, sensor 106 includes a transmitter 120 and a receiver 122. In some implementations, sensor 106 may also include one or more optical elements 124.

Transmitter 120 may be configured to transmit a signal toward an environment of system 100.

In a first example, where sensor 106 is configured as a LIDAR sensor, transmitter 120 may include one or more light sources (not shown) that emit one or more light beams and/or pulses having wavelengths within a wavelength range. The wavelength range could, for example, be in the ultraviolet, visible, and/or infrared portions of the electromagnetic spectrum depending on the configuration of the light sources. In some examples, the wavelength range can be a narrow wavelength range, such as provided by lasers and/or some light emitting diodes. In some examples, the light source(s) in transmitter 120 may include laser diodes, diode bars, light emitting diodes (LEDs), vertical cavity surface emitting lasers (VCSELs), organic light emitting diodes (OLEDs), polymer light emitting diodes (PLEDs), light emitting polymers (LEPs), liquid crystal displays (LCDs), microelectromechanical systems (MEMS), fiber lasers, and/or any other device configured to selectively transmit, reflect, and/or emit light to provide a plurality of emitted light beams and/or pulses.

In a second example, where sensor 106 is configured as an active infrared (IR) camera, transmitter 120 may be configured to emit IR radiation to illuminate a scene. To that end, transmitter 120 may include any type of device (e.g., light source, etc.) configured to provide the IR radiation.

In a third example, where sensor 106 is configured as a RADAR sensor, transmitter 120 may include one or more antennas configured to emit a modulated radio-frequency (RF) signal toward an environment of system 100.

In a fourth example, where sensor 106 is configured as a SONAR sensor, transmitter 120 may include one or more acoustic transducers, such as piezoelectric transducers, magnetostrictive transducers, electrostatic transducers, etc., configured to emit a modulated sound signal toward an environment of system 100. In some implementations, the acoustic transducers can be configured to emit sound signals within a particular wavelength range (e.g., infrasonic, ultrasonic, etc.). Other examples are possible as well.

Receiver 122 may include one or more detectors configured to detect reflections of the signal emitted by transmitter 120.

In a first example, where sensor 106 is configured as a RADAR sensor, receiver 122 may include one or more antennas configured to detect reflections of the RF signal transmitted by transmitter 120. To that end, in some implementations, the one or more antennas of transmitter 120 and receiver 122 can be physically implemented as the same physical antenna structures.

In a second example, where sensor 106 is configured as a SONAR sensor, receiver 122 may include one or more sound sensors (e.g., microphones, etc.) that are configured to detect reflections of the sound signals emitted by transmitter 120. To that end, in some implementations, the one or more components of transmitter 120 and receiver 122 can be physically implemented as the same physical structures (e.g., the same piezoelectric transducer element).

In a third example, where sensor 106 is configured as an active IR camera, receiver 122 may include one or more light detectors (e.g., active pixel sensors, etc.) that are configured to detect a source wavelength of IR light transmitted by transmitter 120 and reflected off a scene toward receiver 122.

In a fourth example, where sensor 106 is configured as a LIDAR sensor, receiver 122 may include one or more light detectors (e.g., photodiodes, avalanche photodiodes, etc.) that are arranged to intercept and detect reflections of the light pulses emitted by transmitter 120 and reflected from one or more objects in a surrounding environment of system 100. To that end, receiver 122 may be configured to detect light having wavelengths in the same wavelength range as the light emitted by transmitter 120. In this way, for instance, sensor 106 (e.g., LIDAR) may distinguish reflected light pulses originated by transmitter 120 from other light originating from external light sources in the environment.

In some instances, receiver 122 may include a photodetector array, which may include one or more detectors each configured to convert detected light (e.g., in the wavelength range of light emitted by transmitter 120) into an electrical signal indicative of the detected light. In practice, such a photodetector array could be arranged in one of various ways. For instance, the detectors can be disposed on one or more substrates (e.g., printed circuit boards (PCBs), flexible PCBs, etc.) and arranged to detect incoming light. Also, such a photodetector array could include any feasible number of detectors aligned in any feasible manner. Additionally, the detectors in the array may take various forms. For example, the detectors may take the form of photodiodes, avalanche photodiodes (e.g., Geiger mode and/or linear mode avalanche photodiodes), silicon photomultipliers (SiPMs), phototransistors, cameras, active pixel sensors (APS), charge coupled devices (CCD), cryogenic detectors, and/or any other sensor of light configured to receive focused light having wavelengths in the wavelength range of the emitted light.

In some implementations, sensor 106 (e.g., in a LIDAR configuration) can select or adjust a horizontal scanning resolution by changing a rate of rotation of the LIDAR and/or adjusting a pulse rate of light pulses emitted by transmitter 120. As a specific example, transmitter 120 can be configured to emit light pulses at a pulse rate of 15,650 light pulses per second. In this example, LIDAR 106 may be configured to rotate at 10 Hz (i.e., ten complete 3600 rotations per second). As such, receiver 122 can detect light with a 0.23° horizontal angular resolution. Further, the horizontal angular resolution of 0.23° can be adjusted by changing the rate of rotation of LIDAR 106 or by adjusting the pulse rate. For instance, if LIDAR 106 is instead rotated at 20 Hz, the horizontal angular resolution may become 0.46°. Alternatively, if transmitter 120 emits the light pulses at a rate of 31,300 light pulses per second while maintaining the rate of rotation of 10 Hz, then the horizontal angular resolution may become 0.115°. Other examples are possible as well. Further, in some examples, LIDAR 106 can be alternatively configured to scan a particular range of views within less than a complete 360° rotation of LIDAR 106.

Optical element(s) 124 can be optionally included in or otherwise coupled to transmitter 120 and/or receiver 122. In one example (e.g., where sensor 106 includes a LIDAR sensor), optical element(s) 124 can be arranged to direct light from a light source in transmitter 120 toward the environment. In another example, optical element(s) 124 can be arranged to focus and/or guide light from the environment toward receiver 122. As such, optical element(s) 124 may include any feasible combination of mirror(s), waveguide(s), light filters, lens(es), or any other optical components arranged to guide propagation of light through physical space and/or adjust certain light characteristics. For instance, optical elements 124 may include a light filter arranged to reduce or prevent light having wavelengths outside the wavelength range of the light emitted by transmitter 120 from propagating toward receiver 122. With such arrangement for instance, the light filter can reduce noise due to background light propagating from the scanned environment and originating from an external light source different than light sources of transmitter 120.

Sensor(s) 108 may include any type of sensor configured to scan the surrounding environment. As shown, sensors 108 include an array of sensing elements 128. Further, as shown, sensors 108 can optionally include one or more optical elements 130.

In some examples, sensor(s) 108 may include active sensors (e.g., LIDAR, RADAR, SONAR, etc.) that transmit signals and detect reflections thereof. Thus, although not shown, sensors 108 may include a transmitter and a receiver that are similar to, respectively, transmitter 120 and receiver 122. In other examples, sensor(s) 108 may include passive sensors (e.g., microphones, cameras, image sensors, thermometers, etc.) that detect external signals originating from one or more external sources.

In a first example, where sensor 108 is configured as a sound sensor, sensing elements 128 may include an array of microphones that each detect sounds (e.g., external signals) incident on the respective microphones in the array.

In a second example, where sensor(s) 108 are configured as one or more cameras, the camera(s) may include any camera (e.g., a still camera, a video camera, etc.) configured to capture images of the environment in which system 100 is located. For example, a camera of sensor 108 may include any imaging device that detects and provides data indicative of an image. For instance, sensing elements 128 may include one or more arrangements of light sensing elements that each provide a measure of light incident thereon. To that end, sensing elements 128 may include charge-coupled devices (CCDs), active pixel sensors, complementary metal-oxide-semiconductor (CMOS) photodetectors, N-type metal-oxide-semiconductor (NMOS) photodetectors, among other possibilities. Such sensing elements 128 could be mounted to a ceramic circuit board as described elsewhere herein.

Further, in some examples, data from sensing elements 128 can be combined according to the arrangement of the sensing elements 128 to generate an image. In one example, data from a two-dimensional (2D) array of sensing elements may correspond to a 2D array of image pixels in the image. In another example, a 3D arrangement of sensing elements (e.g., sensing elements arranged along a curved surface) can be similarly used to generate a 2D array of image pixels in the image. Other examples are possible as well.

In some examples, a sensing element can optionally include multiple adjacent light detectors (or detectors of other types of signals), where each detector is configured to detect light (or other signal) having a particular wavelength or wavelength range. For instance, an image pixel may indicate color information (e.g., red-green-blue or RGB) based on a combination of data from a first detector that detects an intensity of red light, a second detector that detects an intensity of green light, and a third detector that detects an intensity of blue light. Other examples are possible as well.

In one embodiment, sensor(s) 108 may be configured to detect visible light propagating from the scene. Further, in this embodiment, receiver 122 of sensor 106 (e.g., LIDAR receiver) may be configured to detect invisible light (e.g., infrared, etc.) within a wavelength range of light emitted by transmitter 120. In this embodiment, system 100 (or controller 104) can then combine data from sensor 106 (e.g., LIDAR) with data from sensor 108 (e.g., camera) to generate a colored three-dimensional (3D) representation (e.g., point cloud) of the scanned environment.

In some examples, sensor(s) 108 may comprise a plurality of cameras (e.g., a camera ring) disposed in a circular arrangement around an axis of rotation of sensor 106 (e.g., LIDAR). For example, a first camera may be arranged to image a first field-of-view (FOV) of the environment that at least partially overlaps a range of pointing directions of sensor 106 as sensor 106 rotates about the axis (or as the signals transmitted by transmitter 120 are otherwise steered to different pointing directions about the axis). Further, a second camera adjacent to and/or overlapping the first camera may image a second FOV adjacent to the first FOV of the first camera, and so on. In this way, for instance, system 100 may be configured to capture a sequence of images of the respective FOVs simultaneously (and/or synchronously or according to some other timing) with a scan of the environment by sensor 106 as sensor 106 rotates about the axis.

In an example, where sensor(s) 108 include one or more cameras, each pixel or group of pixels output by the camera(s) may be associated with a respective exposure time period of a corresponding sensing element or group of sensing elements to external light. By way of example, camera(s) 108 may together provide an array of adjacent rows of sensing elements 128. Further, camera(s) 108 can be configured to output a sequence of image pixels that correspond to measurements of the external light by corresponding sensing elements in the array. For example, camera(s) 108 may output a first row of image pixels based on data from a first row of sensing elements in the array, followed by a second row of image pixels based on data from a second adjacent row of sensing elements in the array, and so on.

In this way, the first image pixel row may be associated with a first exposure time period during which the first row of sensing elements was exposed to light, the second image pixel row may be associated with a second exposure time period during which the second adjacent row of sensing elements was exposed to light, etc. The first exposure time period may begin before the second exposure time period begins. For instance, after a time delay from a start time of the first exposure time period (and optionally before the first exposure time period lapses), camera(s) 108 may start exposing the second adjacent row of sensing elements. Additionally, the first exposure time period may end before the second exposure time period ends. For instance, controller 104 may read outputs from the first row of sensing elements after the first exposure time period ends and while the second row of sensing elements is still being exposed to the external light, and then read outputs from the second row of sensing elements after the second exposure period ends and while a third row of sensing elements is still being exposed to the external light, and so on.

In some examples, where sensor 106 includes an image sensor, system 100 may be configured to select the order in which the sequence of image pixels are obtained from sensing elements 128 in the rolling shutter mode based on an order in which transmitter 120 is emitting light pulses (or other signals). For example, a given row of sensing elements in the array of sensing elements 128 may be aligned (e.g., parallel, etc.) with the axis of rotation of a LIDAR (e.g., sensor 106). For instance, if the axis of rotation of the LIDAR is a vertical axis, then the given row may correspond to a vertical row of sensing elements (e.g., vertical linear arrangement parallel to the axis of rotation of the LIDAR). Further, transmitter 120 may be configured to output a plurality of light beams in an arrangement of one or more vertical lines repeatedly as the LIDAR (e.g., sensor 106) rotates about the axis. As such, for example, sensor(s) 108 (e.g., camera(s)) may output a first row of image pixels using a first row of sensing elements that are arranged similarly (e.g., vertically, etc.) to the arrangement of the plurality of light beams emitted by transmitter 120. Next, camera(s) 108 may then output a second row of image pixels using a second adjacent row of sensing elements in the direction of the rotation of the LIDAR (or other sensor 106). Thus, for instance, the second row of image pixels may be aligned with a second vertical line of light beams emitted by transmitter 120 after sensor 106 rotates toward the second row of sensing elements, and so on.

By scanning vertical rows of sensing elements one after another, for instance, the sequence of image pixels obtained from camera(s) 108 may include a sufficient number of pixels that were captured at times (and from viewing directions) that are similar to the times and directions of LIDAR light pulses (or other signals) emitted by transmitter 120 (e.g., as transmitter 120 rotates about a vertical axis). Whereas, for instance, if the camera(s) (e.g., sensor(s) 108) instead captured the sequence of image pixels using a first horizontal row of sensing elements followed by a second horizontal row of sensing elements and so on, then fewer image pixels may be captured at times (and from viewing directions) that are similar to the times and directions of the LIDAR light pulses.

Optical element(s) 130 may include any combination of optical components such as lens(es), mirror(s), waveguide(s), light filter(s) or any other type of optical component similarly to optical element(s) 124. Further, optical elements 130 can be arranged to focus, direct, and/or adjust light characteristics of incident light for propagation toward sensing elements 128. Further, where sensor(s) 108 include a plurality of cameras for instance, optical element(s) 130 may include a plurality of respective camera lenses that focus external light onto respective image sensors of the cameras. In some examples, the optical element(s) 124 could include servomotors, piezo actuators, or other actuator components configured to apply forces and/or torques to a ceramic circuit board to which the sensing elements 128 are mounted to control an orientation and/or location of the sensing elements 128 (e.g., to ensure that the sensing elements 128 are located along a focal plane of a lens or other optical system).

In some examples, optical element(s) 130 may include one or more light filters that selectively transmit particular wavelengths of light toward one or more particular sensing elements of sensor 106.

In a first example, optical element(s) 130 may include one or more light filters that attenuate light wavelengths of light emitted by transmitter 120. With this arrangement, for instance, system 100 can reduce noise measurements (by sensing element(s) 128) that are associated with the high intensity of light pulses (or other signals) emitted by transmitter 120.

In a second example, sensor 108 may include color image sensors (e.g., Bayer filter sensor, layered pixel sensor array, etc.) configured to indicate colors of incident light. In this example, optical element(s) 130 may include a color filter array, where each color filter of the array transmits red, green, or blue light to a particular sensing element adjacent to the color filter (and attenuates other wavelengths of light). System 100 can then generate (e.g., by combining outputs from multiple sensing elements that sense light having different colors) image pixels that indicate color information (e.g., red, green, and blue, etc.).

In a third example, optical element(s) 130 may include one or more filters that attenuate wavelengths of the light (or other signal) emitted by transmitter 120 and one or more other filters that allow transmission of these wavelengths. For instance, optical element(s) 130 may include a color filter array that includes green, red, and blue light filters. In this instance, a relatively large number of the color filters can be configured to attenuate the wavelengths of the emitted light of transmitter 120 to reduce the effects of the high intensity signals emitted by transmitter 120. Further, a relatively smaller number of the color filters (e.g., one or more of the green light filters, etc.) can be configured to (at least partially) allow transmission of wavelengths of the light (or other signal) emitted by transmitter 120. With this arrangement, the high intensity light of transmitter 120 (reflecting off objects in the environment of system 100) can be used to illuminate one or more sensing elements in dark external light conditions (e.g., night time).

Rotating platform 110 may be configured to rotate about an axis. For example, sensor 106 (and/or transmitter 120 and receiver 122 thereof) may be supported (directly or indirectly) by rotating platform 110 such that each of these components moves relative to the environment in response to rotation of rotating platform 110. In particular, each of these components could be rotated (simultaneously) relative to an axis so that sensor 106 may obtain information from various directions. In some examples, the axis of rotation of rotating platform 110 is vertical and a pointing direction of sensor 106 can be adjusted horizontally by the rotation of rotating platform 110 about its vertical axis of rotation. Rotating platform 110 can be formed from any solid material suitable for supporting one or more components (e.g., sensor 106) mounted thereon.

In order to rotate platform 110 in this manner, one or more actuators 112 may actuate rotating platform 110. To that end, actuators 112 may include motors, pneumatic actuators, hydraulic pistons, and/or piezoelectric actuators, among other possibilities.

With this arrangement, controller 104 could operate actuator 112 to rotate rotating platform 110 in various ways so as to obtain information about the environment. In one example, rotating platform 110 could be rotated in either direction. In another example, rotating platform 110 may carry out complete revolutions such that sensor 106 (e.g., LIDAR) provides a 3600 horizontal FOV of the environment. Moreover, rotating platform 110 may rotate at various frequencies so as to cause sensor 106 to scan the environment at various refresh rates and/or scanning resolutions.

Alternatively or additionally, system 100 may be configured to adjust the pointing direction of the emitted signal (emitted by transmitter 120) in various ways. In some examples, signal sources (e.g., light sources, antennas, acoustic transducers, etc.) of transmitter 120 can be operated according to a phased array configuration or other type of beam steering configuration.

In a first example, where sensor 106 is configured as a LIDAR sensor, light sources in transmitter 120 can be coupled to phased array optics (e.g., optical elements 124) that control the phase of light waves emitted by the light sources. For instance, controller 104 can be configured to adjust the phased array optics (e.g., phased array beam steering) to change the effective pointing direction of a light signal emitted by transmitter 120 (e.g., even if rotating platform 110 is not rotating).

In a second example, where sensor 106 is configured as a RADAR sensor, transmitter 120 may include an array of antennas, and controller 104 can provide respective phase-shifted control signals for each individual antenna in the array to modify a pointing direction of a combined RF signal from the array (e.g., phased array beam steering).

In a third example, where sensor 106 is configured as a SONAR sensor, transmitter 120 may include an array of acoustic transducers, and controller 104 can similarly operate the array of acoustic transducers (e.g., via phase-shifted control signals, etc.) to achieve a target pointing direction of a combined sound signal emitted by the array (e.g., even if the rotating platform 110 is not rotating, etc.).

In other examples, the pointing direction of sensor(s) 106 can be controlled using a deforming flexible structure (e.g., MEMs, etc.) that can be deformed in response to a control signal from controller 104 to adjust a steering direction of the signals emitted by transmitter 120. Other examples are possible.

Stationary platform 114 may take on any shape or form and may be configured for coupling to various structures, such as to a top of a vehicle for example. Also, the coupling of stationary platform 114 may be carried out via any feasible connector arrangement (e.g., bolts and/or screws). In this way, system 100 could be coupled to a structure so as to be used for various purposes, such as those described herein. In one example, sensor(s) 108 can be coupled to stationary platform 114. In this example, sensor(s) 108 can remain stationary relative to the rotational motion of sensor(s) 106 (or the otherwise changing beam directions of signals emitted by transmitter 120). In another example, sensor(s) 108 can be mounted to another physical structure different than stationary platform 114.

Rotary link 116 directly or indirectly couples stationary platform 114 to rotating platform 110. To that end, rotary link 116 may take on any shape, form and material that provides for rotation of rotating platform 110 about an axis relative to stationary platform 114. In some examples, rotary link 116 may take the form of a shaft or the like that rotates based on actuation from actuator 112, thereby transferring mechanical forces from actuator 112 to rotating platform 110. In one implementation, rotary link 116 may have a central cavity in which one or more components of system 100 may be disposed. In some examples, rotary link 116 may also provide a communication link for transferring data and/or instructions between stationary platform 114 and rotating platform 110 (and/or components thereon such as sensor(s) 106, etc.).

Housing 118 may take on any shape, form, and material and may be configured to house one or more components of system 100. In one example, housing 118 can be a dome-shaped housing. Further, in some examples, housing 118 may be composed of a material that is at least partially non-transparent, which may allow for blocking of at least some light from entering the interior space of housing 118 and thus help mitigate thermal and noise effects of ambient light on one or more components of system 100. Other configurations of housing 118 are possible as well. In some implementations, housing 118 may be coupled to rotating platform 110 such that housing 118 is configured to rotate about the above-mentioned axis based on rotation of rotating platform 110. In such implementations, sensor(s) 106 may rotate together with housing 118. In other implementations, housing 118 may remain stationary while sensor(s) 106 rotate within housing 118. System 100 could also include multiple housings similar to housing 118 for housing certain sub-systems or combinations of components of system 100. For example, system 100 may include a first housing for sensor(s) 106 and a separate housing for sensor(s) 108. Other examples are possible as well.

Display 140 can optionally be included in system 100 to display information about one or more components of system 100. For example, controller 104 may operate display 140 to display images captured using a camera (e.g., sensor 108), a representation (e.g., 3D point cloud, etc.) of an environment of system 100 indicated by LIDAR data from sensor 106, and/or a representation of the environment based on a combination of the data from sensors 106 and 108 (e.g., colored point cloud, images with superimposed temperature indicators, etc.). To that end, display 140 may include any type of display (e.g., liquid crystal display, LED display, cathode ray tube display, projector, etc.). Further, in some examples, display 140 may have a graphical user interface (GUI) for displaying and/or interacting with images captured by sensor 108, LIDAR data captured using sensor 106, and/or any other information about the various components of system 100 (e.g., power remaining via power supply arrangement 102). For example, a user can manipulate the GUI to adjust a scanning configuration of sensors 106 and/or 108 (e.g., scanning refresh rate, scanning resolution, etc.).

It is noted that the various components of system 100 can be combined or separated into a wide variety of different arrangements. For example, although sensors 106 and 108 are illustrated as separate components, one or more components of sensors 106 and 108 can alternatively be physically implemented within a single device. Thus, this arrangement of system 100 is described for exemplary purposes only and is not meant to be limiting.

Figure 2:
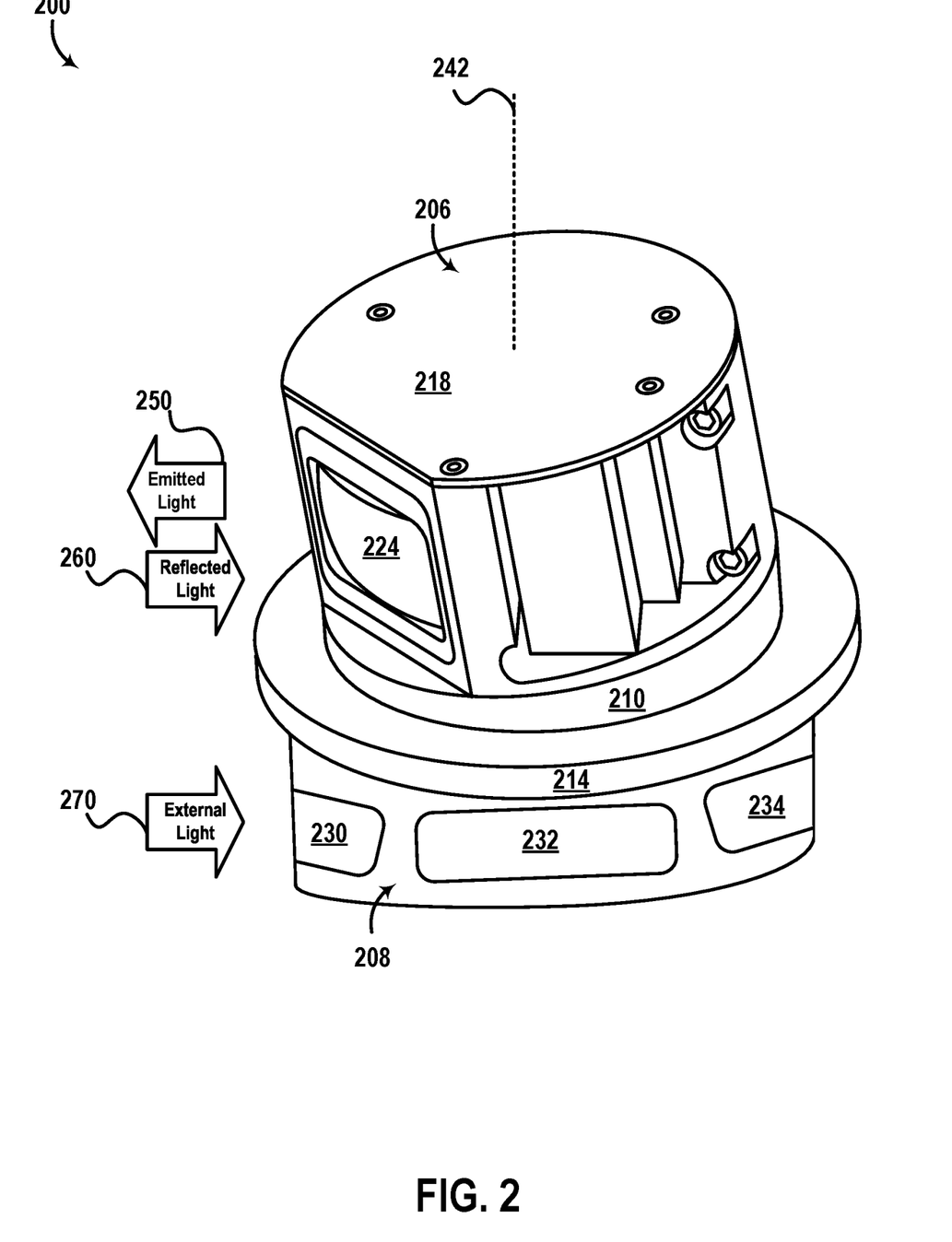
FIG. 2 illustrates a device that includes a rotating LIDAR sensor and a camera arrangement, according to example embodiments.

FIG. 2 illustrates a device 200 that includes a rotating LIDAR sensor 206 and a camera ring 208, according to example embodiments. As shown, device 200 includes a LIDAR 206, camera ring 208 (e.g., arrangement of rolling shutter cameras, etc.), a rotating platform 210, a stationary platform 214, a housing 218, a LIDAR lens 224, and camera lenses 230, 232, 234 which may be similar, respectively, to sensor(s) 106, sensor(s) 108, rotating platform 110, stationary platform 114, housing 118, optical element 124, and optical elements 130, for example.

As shown, light beams 250 emitted by LIDAR 206 propagate from lens 224 along a pointing direction of LIDAR 206 toward an environment of LIDAR 206, and reflect off one or more objects (not shown) in the environment as reflected light 260. Further, as shown, LIDAR 206 may then receive reflected light 290 (e.g., through lens 224). Thus, for instance, LIDAR 206 may provide data (e.g., data point cloud, etc.) indicating distances between the one or more objects and the LIDAR 206 based on detection(s) of the reflected light 290, similarly to the discussion above for sensor 106.

Further, as shown, each camera of camera ring 208 may receive and detect a respective portion of external light 270 incident on the respective camera. To that end, external light 270 may include light originating from one or more external light sources, such as the sun, a street lamp, among other possibilities. For example, external light 270 may include light propagating directly from an external light source toward camera lenses 230, 232, and/or 234. Alternatively or additionally, external light 270 may include light originating from an external light source and reflecting off one or more objects (not shown) in the environment of device 200 before propagating toward lenses 230, 232, and/or 234. Thus, for example, the cameras of camera ring 208 may generate one or more images of the environment based on external light 270. Further, each image generated by a particular camera may correspond to a particular FOV of the particular camera relative to device 200.

To that end, in some examples, camera ring 208 may include a plurality of cameras that are arranged in a ring formation (e.g., circular arrangement, oval arrangement, etc.) relative to one another. Each camera of the plurality can be positioned (e.g., mounted to device 200 and/or camera ring 208) at a particular angle and/or orientation. Thus, for instance, a FOV of a first camera may be adjacent to and/or partially overlapping FOVs of two other adjacent cameras. With this arrangement for instance, images from the individual cameras can be combined into an image of a 360-degree fOV of device 200. Further, during assembly or calibration of device 200 for instance, the respective angle and/or orientation of each camera can be adjusted to reduce or prevent blind spots (e.g., regions of the surrounding environment that are not within the FOV of any camera in camera ring 208). For example, the respective FOVs of two adjacent cameras can be aligned (e.g., by moving, rotating, and/or otherwise adjusting relative mounting positions of the two cameras, etc.) such that a region of the environment between the FOVs of the two cameras (e.g., "blind spot") is less than a threshold distance from device 200.

To facilitate this, in one implementation, camera ring 208 could optionally include a housing (e.g., ring-shaped, etc.) having one or more indentations that receive and/or support the cameras at particular respective mounting positions (e.g., angle, orientation, etc.). In another implementation, an example system (e.g., system 100, a calibration system, etc.) may be configured to compare images captured by the cameras, and to determine, based on the comparison, alignment offsets that achieve respective target FOVs for the respective cameras. The example system may also include and/or operate a robotic arm, an actuator, and/or any other alignment apparatus to adjust the positions of the cameras in camera ring 208 according the determined alignment offsets. Other examples are possible.

In some examples, device 200 (or another computing device coupled thereto) may operate the cameras of camera ring 208 and/or process the captured images therefrom (e.g., combine portions of the captured images, etc.) to form a cohesive circular vision of the environment of device 200. For example, a computing system (not shown) of device 200 or another device may match features in images captured by camera ring 208 to generate a combined image that spans a combination of the FOVs of the cameras.

In one implementation, lens 230 may focus light from a first 90-degree fOV of device 200, lens 232 may focus light from a second adjacent 90-degree fOV, and so on. The first FOV could optionally partially overlap the first FOV. In other implementations, the FOV imaged by each camera may be more or less than 90 degrees. Further, in line with the discussion above, an image captured by any of the cameras in camera ring 208 may indicate various types of information such as light intensities for different wavelengths (e.g., colors, etc.) in external light 270, among other examples.

In some examples, LIDAR 206 (and/or housing 218) can be configured to have a substantially cylindrical shape and to rotate about axis 242, based on rotation of rotating platform 210 that supports LIDAR 206 for instance. Further, in some examples, the axis of rotation 242 may be substantially vertical. Thus, for instance, by rotating LIDAR 206 about axis 242, device 200 (and/or a computing system that operates device 200) can determine a three-dimensional map based on data from LIDAR 206) of a 360-degree view of the environment of device 200. Additionally or alternatively, in some examples, device 200 can be configured to tilt the axis of rotation of rotating platform 210 (relative to stationary platform 214), thereby adjusting the FOV of LIDAR 206. For instance, rotating platform 210 may include a tilting platform that tilts in one or more directions.

In some examples, as shown, LIDAR lens 224 can have an optical power to both collimate (and/or direct) emitted light beams 250 toward an environment of LIDAR 206, and focus reflected light 260 received from the environment onto a LIDAR receiver (not shown) of LIDAR 206. In one example, lens 224 has a focal length of approximately 120 mm. Other example focal lengths are possible. By using the same lens 224 to perform both of these functions, instead of a transmit lens for collimating and a receive lens for focusing, advantages with respect to size, cost, and/or complexity can be provided. Alternatively however, LIDAR 206 may include separate transmit and receive lenses. Thus, although not shown, LIDAR 206 can alternatively include a transmit lens that directs emitted light 250 toward the environment, and a separate receive lens that focuses reflected light 260 for detection by a receiver of LIDAR 206.

It is noted that device 200 may include more, fewer, or different components than those shown, and one or more of the components shown may be combined or separated in different ways. In one example, instead of multiple camera lenses 230, 232, 234, device 200 could alternatively include a single camera lens that extends around a circumference of camera ring 208. In another example, although camera ring 208 is shown to be coupled to stationary platform 214, camera ring 208 can alternatively be implemented as a separate physical structure. In yet another example, camera ring 208 can be positioned above LIDAR 206, without being rotated by rotating platform 214. In still another example, camera ring 208 may include more or fewer cameras than shown. Other examples are possible.

III. EXAMPLE SENSOR ASSEMBLIES

An improved sensor assembly is described that includes a ceramic circuit board. A sensor element (e.g., a planar array of light-sensitive sensor elements) is mounted to a first side of the ceramic circuit board and electronic components (e.g., capacitors, ferrites, regulators) are disposed within two or more recesses on the second side of the ceramic circuit board. At least one of the electronic components is electronically coupled to the sensor elements via electrical traces formed on or within the ceramic circuit board and via one or more pads on the first surface of the ceramic circuit board. The ceramic circuit board includes a stiffening cross-brace portion that separates the two or more recesses and that provides the ceramic circuit board with improved mechanical strength and stiffness. Providing the electronic components on the second side allows the overall size and moment of inertia of the ceramic circuit board to be reduced. Disposing the electronic components within the two or more recesses allows for simplified mounting of the ceramic circuit board to underlying components (e.g., flexible printed circuit boards and/or flex cables, heat sinks) and improved conduction of heat form the ceramic circuit board to such underlying elements.

Figure 3A:
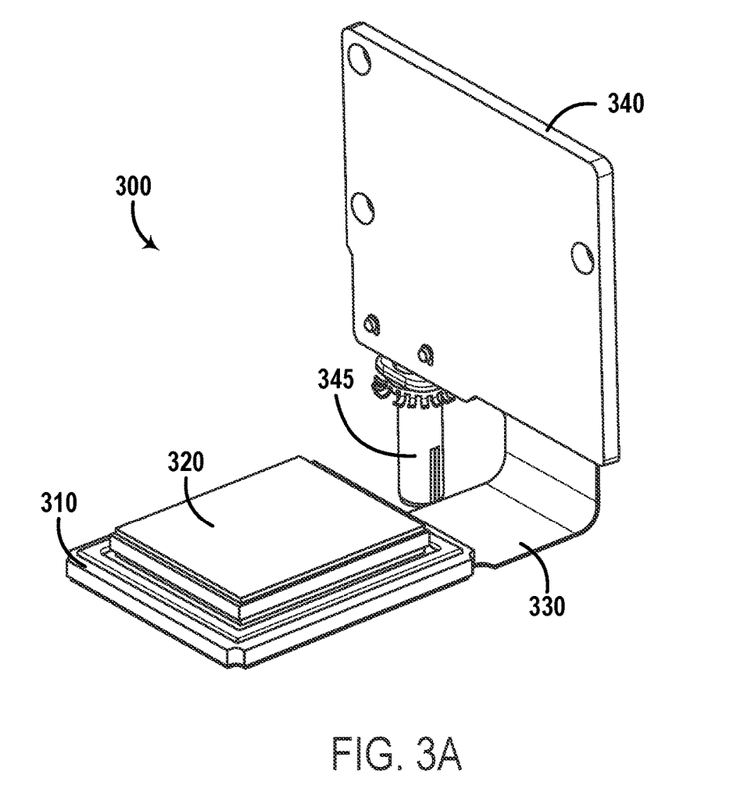
FIG. 3A illustrates a perspective view of components of a camera assembly, according to example embodiments.

FIG. 3A shows elements of such a sensor assembly 300. The sensor assembly 300 includes a ceramic printed circuit board 310 on a first side of which is mounted a sensor element 320. In this example, the sensor element 320 is an image sensor comprising an array of light-sensitive elements (e.g., active pixel sensors, silicon avalanche photodiodes), but other sensor elements are possible. The ceramic printed circuit board 310 is coupled electrically to a flexible printed circuit board 330 which is, in turn, electrically coupled to an interface board 340. The interface board 340 includes a connector 345 via which the sensor assembly 300 may be electrically coupled to additional components, e.g., to the electrical systems of an autonomous vehicle. The sensor assembly 300 may include additional elements, e.g., a housing to protect the illustrated elements and to facilitate mounting them within an automated vehicle, lenses or other optical elements for forming an image onto the sensor element 320, or other components.

Figure 3B:
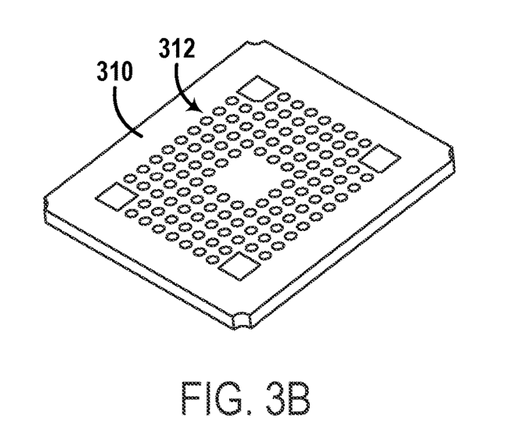
FIG. 3B illustrates a perspective view of a ceramic circuit board, according to example embodiments.

FIG. 3B depicts the first side of the ceramic printed circuit board 310. A number of contact pads 312 are disposed on the first side to facilitate electrical connections between a sensor element 320 (e.g., a sensor package that contains the sensor element 320) and the ceramic printed circuit board 310. As shown in FIG. 3B, the contact pads 312 are provided as an array of pads. This could be done to facilitate electrical connection with pins of a sensor package having a ball grid array, pin grid array, or other grid-patterned configuration of electrical contacts. However, other configurations of contact pads on the ceramic printed circuit board 310 are possible. For example, one or more lines of contact pads could be arranged around a periphery of the ceramic printed circuit board 310 to facilitate wire-bonding to a sensor element that is mounted directly onto the ceramic printed circuit board 310 (rather than being provided in a surface mount sensor package).

Figure 3C:
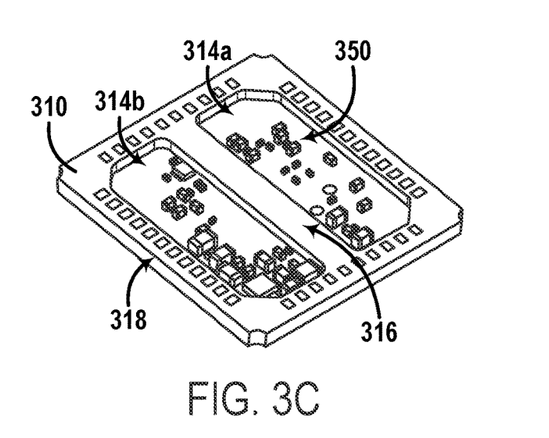
FIG. 3C illustrates another perspective view of the ceramic circuit board of FIG. 3B.

FIG. 3C depicts the second side of the ceramic printed circuit board 310. A number of contact pads 318 are disposed on the second side to facilitate electrical connections between the ceramic printed circuit board 310 and the flexible printed circuit board 330 or some other component. Also depicted are first 314a and second 314b recesses in which are disposed electronic components 350. The electronic components 350 are electrically connected, via traces formed in the ceramic printed circuit board 310, with the sensor element 320 (via the first-side contact pads 312), with the flexible printed circuit board 330 (via the second-side contact pads 318), and/or with each other. The electronic components 350 can include capacitors, ferrites, voltage regulators, power management ICs, microprocessors, bus drivers, or other components whose placement on the ceramic printed circuit board 310 is advantageous. The first 314a and second 314b recesses are separated by a stiffening cross-brace portion 316 of the ceramic printed circuit board 310, which provides increased mechanical strength and stiffness to the ceramic printed circuit board 310. Note that, while second-side contact pads 318 are only shown along the periphery of the ceramic printed circuit board 310, contact pads may additionally or alternatively be provided on the stiffening cross-brace portion 316.

The ceramic printed circuit board 310 may be fabricated out of a variety of different materials using a variety of different processes. For example, the ceramic printed circuit board 310 could be formed using high-temperature co-fired ceramic processes. In such an example, the three-dimensional shape of the ceramic printed circuit board 310 and the pattern of conductive traces within and on the surface of the ceramic printed circuit board 310 could be specified by shaping layers of ceramic-particle-bearing polymer sheets, printing conductive patterns on the sheets, stacking the sheets, and firing the sheets in a kiln. The electronic components 350 may be electronically coupled to the ceramic printed circuit board 310 by using a stepped stencil to apply conductive pastes, using pick-and-place or other techniques to place the electronic components 350 on the applied conductive paste, and then reflowing the conductive paste.

The ceramic printed circuit board 310 could be coupled to servomotors, piezo elements, or other actuators to facilitate active control of the orientation and/or location of the sensor element 320. This could be done to adjust an angle along which an image sensor can detect images, to adjust the focus of an image sensor, to ensure that an image sensor remains aligned with a focal plane of an optical system (e.g., as the temperature of the optical system changes, as the alignment of the optical system and image sensor changes due to mechanical shock, vibration, etc.), or to accomplish some other goal. The ceramic printed circuit board 310 could be mechanically coupled to such actuators directly or through intervening elements, e.g., the flexible printed circuit board 330, a heat sink, a thermal paste, a barrel of an optical system that is adhered to the ceramic printed circuit board 310, etc.

A ceramic printed circuit board as described herein is not limited to having two recesses separated by a single stiffening cross-brace portion. Such a ceramic printed circuit board could include additional recesses and/or additional stiffening cross-brace portions. Such stiffening cross-brace portions could be parallel (to provide additional stiffness in a single direction), perpendicular (to provide additional stiffness in orthogonal directions), or could have some other relationship. Such additional stiffening cross-brace portions could also provide additional area for transmitting heat to a heat sink, for electrically connecting to underlying components (e.g., flexible printed circuit boards), or could provide some other benefits.

Figure 4:
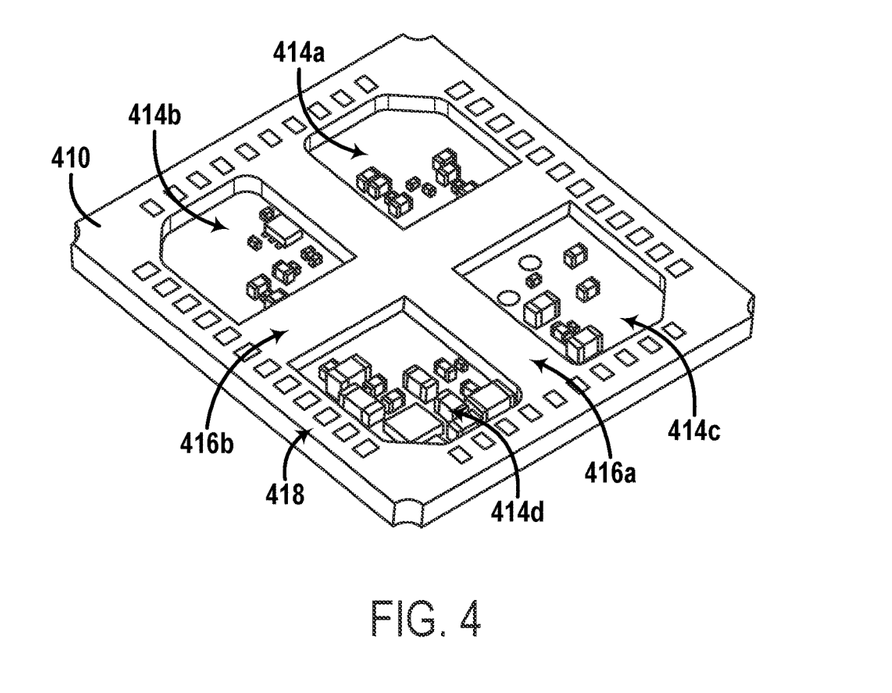
FIG. 4 illustrates a perspective view of a ceramic circuit board, according to example embodiments.

FIG. 4 depicts such a ceramic printed circuit board 410. The ceramic printed circuit board 410 includes first 414a, second 414b, third 414c, and fourth 414d recesses in which are disposed electronic components. A number of contact pads 418 are also provided. The ceramic printed circuit board 410 includes a first stiffening cross-brace portion 416a that separates the first recess 414a from the second recess 414b and that separates the third recess 414c from the fourth recess 414d. The ceramic printed circuit board 410 also includes a second stiffening cross-brace portion 416b that separates the first recess 414a from the third recess 414c and that separates the second recess 414b from the fourth recess 414d.

A sensor element can be disposed on a ceramic printed circuit board in a variety of ways. In some examples, the sensor element can be provided in a sensor package that is, in turn, mounted onto contact pads of the ceramic printed circuit board. Such a sensor package could include a bezel, a printed circuit board substrate, a cover glass, contact pads or pins (e.g., arranged according to a ball grid array pattern), or other elements to facilitate mounting of the sensor element to the ceramic printed circuit board, to facilitate handling of the sensor element during assembly, to protect the sensor element, etc.

Figure 5A:
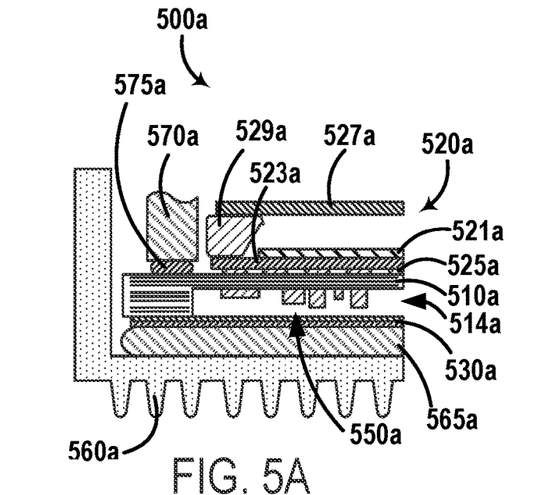
FIG. 5A illustrates a cross-sectional view of elements of a camera assembly, according to example embodiments.

An example of a sensor assembly that includes such a sensor package is depicted, in cross-sectional view, in FIG. 5A. The sensor assembly 500a includes a ceramic printed circuit board 510a. A sensor package 520a is mounted to a first surface of the ceramic printed circuit board 510a. Electronics 550a are disposed within recesses 514a formed into a second side of the ceramic printed circuit board 510a. The sensor package 520a includes a substrate 523a on which a sensor element 521a (e.g., an image sensor) is disposed. A bezel 529a and protective window 527a are also disposed on the substrate 523a. The sensor element 521a is electrically coupled to the substrate 523a (e.g., via wire bonds) which is, in turn, electrically coupled to the ceramic circuit board 510a via contact pads 525a (e.g., pins of a pin grid array, balls of a ball grid array, lands of a land grid array).

The ceramic printed circuit board 510a is disposed on a flexible printed circuit board 530a which is, in turn, coupled to a heat sink 560a via a thermally conductive adhesive 565a. The ceramic printed circuit board 510a could be electrically coupled to the flexible printed circuit board 530a using an anisotropic conductive film, using reflow, or using some other means. A housing 570a of an optical system (e.g., one or more mirrors, lenses, filters, etc.) is coupled to the ceramic circuit board 510a via an adhesive 575a. The adhesive 575a could be applied and cured using an active alignment process, such that the sensor element 521a is aligned with a focal plane or other optical feature or parameter of the optical system.

Alternatively, a sensor element could be disposed directly on a ceramic printed circuit board. An example of such a sensor assembly is depicted, in cross-sectional view, in FIG. 5B. The sensor assembly 500b includes a ceramic printed circuit board 510b. A sensor element 521b is mounted to a first surface of the ceramic printed circuit board 510b. Electronics 550b are disposed within recesses 514b formed into a second side of the ceramic printed circuit board 510b. The sensor element 521b is electrically coupled to contact pads on the first surface of the ceramic circuit board 510b via wire bonds, conductive adhesive, or some other electrical connection means. A bezel 529b and protective window 527b are also disposed on the ceramic printed circuit board 510b.

Figure 5B:
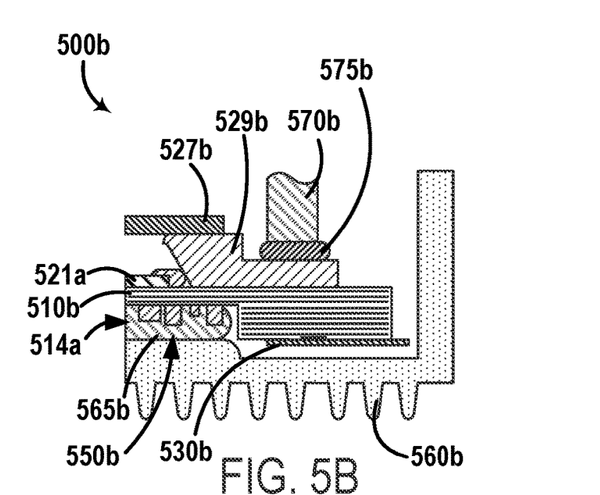
FIG. 5B illustrates a cross-sectional view of elements of a camera assembly, according to example embodiments.

The ceramic printed circuit board 510b is disposed on a flexible printed circuit board 530b. The ceramic printed circuit board 510b is also coupled to a heat sink 560b via a thermally conductive adhesive 565b. The thermally conductive adhesive 565b passes through a window formed in the flexible printed circuit board 530b to allow for direct conduction of heat from the electronics 550b and/or the ceramic printed circuit board 510b to the heat sink 560b via the thermally conductive adhesive 565b. The ceramic printed circuit board 510b could be electrically coupled to the flexible printed circuit board 530b using an anisotropic conductive film, using reflow, or using some other means. A housing 570b of an optical system (e.g., one or more mirrors, lenses, filters, etc.) is coupled to the ceramic circuit board 510b via an adhesive 575b. The adhesive 575b could be applied and cured using an active alignment process, such that the sensor element 521b is aligned with a focal plane or other optical feature or parameter of the optical system.

IV. CONCLUSION

The particular arrangements shown in the Figures should not be viewed as limiting. It should be understood that other implementations may include more or less of each element shown in a given Figure. Further, some of the illustrated elements may be combined or omitted. Yet further, an exemplary implementation may include elements that are not illustrated in the Figures. Additionally, while various aspects and implementations have been disclosed herein, other aspects and implementations will be apparent to those skilled in the art. The various aspects and implementations disclosed herein are for purposes of illustration and are not intended to be limiting, with the true scope and spirit being indicated by the following claims. Other implementations may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations.

What is claimed:
1. A sensor assembly comprising:
a sensor element;
a ceramic printed circuit board having a first side and a second side, wherein the first side is opposite the second side, wherein the sensor element is disposed on the first side of the ceramic printed circuit board, wherein the second side of the ceramic printed circuit board includes two or more recesses and a stiffening cross-brace portion that separates and at least partially defines two of the two or more recesses, and wherein the ceramic printed circuit board comprises a first contact pad that is disposed on the first side and that is electrically coupled to the sensor element; and one or more electronic components, wherein the one or more electronic components are disposed on the second side of the ceramic printed circuit board within at least one of the two or more recesses, and wherein at least one electronic component of the one or more electronic components is electrically coupled to the first contact pad.

2. The sensor assembly of claim 1, wherein the sensor element comprises an image sensor.

3. The sensor assembly of claim 2, wherein the image sensor is disposed within a sensor package having a package contact pad, and wherein the package contact pad is electrically coupled to the first contact pad.

4. The sensor assembly of claim 2, wherein the image sensor includes an image sensor bond pad, and wherein the image sensor bond pad is electrically coupled to the first pad via a wire bond.

5. The sensor assembly of claim 1, wherein the ceramic circuit board additionally comprises a second contact pad that is disposed on the second side, wherein at least one electronic component of the one or more electronic components is electrically coupled to the second contact pad, and wherein the sensor assembly further comprises:

a flexible printed circuit board, wherein the flexible printed circuit board is electrically coupled to the second contact pad.

6. The sensor assembly of claim 5, wherein the flexible printed circuit board extends at least partially across at least one recess of the two or more recesses.

7. The sensor assembly of claim 5, further comprising:

a heat sink, wherein the flexible printed circuit board extends partially across a first recess of the two or more recesses, and wherein the flexible printed circuit board includes a window; and a volume of thermally conductive paste, wherein the volume of thermally conductive paste is in contact with the heat sink, is at least partially disposed within the first recess, and extends through the window.

8. The sensor assembly of claim 5, wherein the second contact pad is disposed on the stiffening cross-brace portion.

9. The sensor assembly of claim 1, wherein the two or more recesses include first, second, third, and fourth recesses, wherein the stiffening cross-brace portion separates the first recess from the second recess and the third recess from the fourth recess, and wherein the ceramic printed circuit board additionally includes an additional stiffening cross-brace portion that separates the first recess from the third recess and the second recess from the fourth recess.

10. The sensor assembly of claim 1, further comprising a mechanical actuator that is mechanically coupled to the ceramic printed circuit board, wherein the mechanical actuator is operable to adjust at least one of a location or an orientation of the ceramic printed circuit board.

11. A ceramic printed circuit board having a first side and a second side, wherein the first side is opposite the second side, wherein the second side of the ceramic printed circuit board includes two or more recesses and a stiffening cross-brace portion that separates and at least partially defines two of the two or more recesses, wherein the ceramic printed circuit board comprises a first contact pad that is disposed on the first side and a second contact pad that is disposed on the second side in one of the two or more recesses and that is electrically coupled to the first contact pad.

12. The ceramic printed circuit board of claim 11, further comprising a third contact pad that is disposed on the first side and a fourth contact pad that is disposed on the second side and that is electrically coupled to the third contact pad, wherein the fourth contact pad is not disposed in any of the two or more recesses.

13. The ceramic printed circuit board of claim 12, wherein the fourth contact pad is disposed on the stiffening cross-brace portion.

14. The ceramic printed circuit board of claim 11, wherein the two or more recesses include first, second, third, and fourth recesses, wherein the stiffening cross-brace portion separates the first recess from the second recess and the third recess from the fourth recess, and wherein the ceramic printed circuit board additionally includes an additional stiffening cross-brace portion that separates the first recess from the third recess and the second recess from the fourth recess.

15. A sensor assembly comprising:

a sensor element;

a ceramic printed circuit board having a first side and a second side, wherein the first side is opposite the second side, wherein the sensor element is disposed on the first side of the ceramic printed circuit board, wherein the second side of the ceramic printed circuit board includes a first recess, a second recess, and a stiffening cross-brace portion that separates and at least partially defines the first and second recesses, and wherein the ceramic printed circuit board comprises a first contact pad that is disposed on the first side and that is electrically coupled to the sensor element; and one or more electronic components, wherein the one or more electronic components are disposed on the second side of the ceramic printed circuit board within at least one of the first recess or the second recess, and wherein at least one electronic component of the one or more electronic components is electrically coupled to the first contact pad.

16. The sensor assembly of claim 15, wherein the sensor element comprises an image sensor.

17. The sensor assembly of claim 16, wherein the image sensor is disposed within a sensor package having a package contact pad, and wherein the package contact pad is electrically coupled to the first contact pad.

18. The sensor assembly of claim 16, wherein the image sensor includes an image sensor bond pad, and wherein the image sensor bond pad is electrically coupled to the first pad via a wire bond.

19. The sensor assembly of claim 15, wherein the ceramic circuit board additionally comprises a second contact pad that is disposed on the second side, wherein at least one electronic component of the one or more electronic components is electrically coupled to the second contact pad, and wherein the sensor assembly further comprises:

a flexible printed circuit board, wherein the flexible printed circuit board is electrically coupled to the second contact pad.

20. The sensor asesembly of claim 15, further comprising a mechanical actuator that is mechanically coupled to the ceramic printed circuit board, wherein the mechanical actuator is operable to adjust at least one of a location or an orientation of the ceramic printed circuit board.

* * * * *